(12) United States Patent
Tsao et al.

(10) Patent No.: US 9,129,985 B2
(45) Date of Patent: Sep. 8, 2015

(54) SEMICONDUCTOR DEVICE HAVING METAL GATE AND MANUFACTURING METHOD THEREOF

(71) Applicant: UNITED MICROELECTRONICS CORP., Hsin-Chu (TW)

(72) Inventors: Po-Chao Tsao, New Taipei (TW); Chien-Ting Lin, Hsinchu (TW); Chien-Ming Lai, Tainan (TW); Chi-Mao Hsu, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 148 days.

(21) Appl. No.: 13/784,839

(22) Filed: Mar. 5, 2013

(65) Prior Publication Data

US 2014/0252423 A1    Sep. 11, 2014

(51) Int. Cl.
  *H01L 29/76*   (2006.01)
  *H01L 29/94*   (2006.01)
  *H01L 29/66*   (2006.01)
  *H01L 29/49*   (2006.01)
  *H01L 29/51*   (2006.01)
  *H01L 29/78*   (2006.01)
  *H01L 21/8238* (2006.01)

(52) U.S. Cl.
  CPC .. *H01L 29/66545* (2013.01); *H01L 21/823842* (2013.01); *H01L 29/4966* (2013.01); *H01L 29/51* (2013.01); *H01L 29/7833* (2013.01)

(58) Field of Classification Search
  CPC ................................ H01L 29/78; H01L 29/49
  USPC .......................................... 257/288; 438/591
  See application file for complete search history.

(56) References Cited

U.S. PATENT DOCUMENTS

| 6,033,963 | A  | 3/2000  | Huang       |
| 6,653,698 | B2 | 11/2003 | Lee         |
| 6,858,483 | B2 | 2/2005  | Doczy       |
| 6,921,711 | B2 | 7/2005  | Cabral, Jr. |
| 6,953,719 | B2 | 10/2005 | Doczy       |
| 6,967,131 | B2 | 11/2005 | Saenger     |
| 6,972,225 | B2 | 12/2005 | Doczy       |
| 7,029,966 | B2 | 4/2006  | Amos        |

(Continued)

OTHER PUBLICATIONS

Ssu-I Fu et al., Title: Manufacturing Method for Semiconductor Device Having Metal Gate, pending U.S. Appl. No. 13/326,342, filed Dec. 15, 2011.

(Continued)

*Primary Examiner* — Theresa T Doan
(74) *Attorney, Agent, or Firm* — Winston Hsu; Scott Margo

(57) ABSTRACT

A manufacturing method of semiconductor devices having metal gate includes following steps. A substrate having a first semiconductor device and a second semiconductor device formed thereon is provided. The first semiconductor device includes a first gate trench and the second semiconductor device includes a second gate trench. A first work function metal layer is formed in the first gate trench and the second gate trench. A portion of the first work function metal layer is removed from the second gate trench. A second work function metal layer is formed in the first gate trench and the second gate trench. The second work function metal layer and the first work function metal layer include the same metal material. A third work function metal layer and a gap-filling metal layer are sequentially formed in the first gate trench and the second gate trench.

5 Claims, 9 Drawing Sheets

(56) References Cited

U.S. PATENT DOCUMENTS

| | | |
|---|---|---|
| 7,056,794 B2 | 6/2006 | Ku |
| 7,064,050 B2 | 6/2006 | Cabral, Jr. |
| 7,064,066 B1 | 6/2006 | Metz |
| 7,074,680 B2 | 7/2006 | Doczy |
| 7,112,851 B2 * | 9/2006 | Saenger et al. ............... 257/350 |
| 7,126,199 B2 | 10/2006 | Doczy |
| 7,148,548 B2 | 12/2006 | Doczy |
| 7,153,734 B2 | 12/2006 | Brask |
| 7,157,378 B2 | 1/2007 | Brask |
| 7,183,184 B2 | 2/2007 | Doczy |
| 7,220,635 B2 | 5/2007 | Brask |
| 7,316,949 B2 | 1/2008 | Doczy |
| 7,317,231 B2 | 1/2008 | Metz |
| 7,326,610 B2 | 2/2008 | Amos |
| 7,355,281 B2 | 4/2008 | Brask |
| 7,390,709 B2 | 6/2008 | Doczy |
| 2007/0262451 A1 | 11/2007 | Rachmady |
| 2009/0039433 A1 | 2/2009 | Yang |
| 2009/0057769 A1 | 3/2009 | Wei |
| 2009/0186458 A1 | 7/2009 | Yu |
| 2010/0052066 A1 | 3/2010 | Yu |
| 2010/0065926 A1 | 3/2010 | Yeh |
| 2010/0068877 A1 | 3/2010 | Yeh |
| 2012/0068261 A1 * | 3/2012 | Kwon et al. ................ 257/331 |

OTHER PUBLICATIONS

Wen-Tai Chiang et al., Title: Semiconductor Device Having Metal Gate and Manufacturing Method Thereof, pending U.S. Appl. No. 13/480,499, filed May 25, 2012.

* cited by examiner

SEMICONDUCTOR DEVICE HAVING METAL GATE AND MANUFACTURING METHOD THEREOF

BACKGROUND OF THE INVENTION

1. Field of the Invention

The invention relates to a semiconductor device having metal gate and manufacturing method thereof, and more particularly, to a semiconductor device having metal gate and manufacturing method capable of reducing process complexity.

2. Description of the Prior Art

With a trend toward scaling down the size of the semiconductor device, work function metals are used to replace the conventional polysilicon gate to be the control electrode that competent to the high dielectric constant (herein after abbreviated as high-k) gate dielectric layer. The conventional metal gate methods are categorized into the gate first process and the gate last process. Among the two main processes, the gate last process is able to avoid processes of high thermal budget and to provide wider material choices for the high-k gate dielectric layer and the metal gate, and thus the gate last process gradually replaces the gate first process.

In the conventional gate last process, a dummy gate or a replacement gate is formed on a substrate and followed by steps of forming a conventional metal-oxide semiconductor (MOS) transistor device. Subsequently, the dummy/replacement gate is removed to form a gate trench. Then the gate trench is filled with work function metals required by different conductivity types.

Accordingly, though the gate last process is able to avoid processes of high thermal budget and to provide wider material choices for the high-k gate dielectric layer and the metal gate, the gate last process still faces integrity requirements for the complicated processes and reliability requirement for the layers filling in the gate trench.

SUMMARY OF THE INVENTION

According to an aspect of the present invention, a manufacturing method of semiconductor devices having metal gate is provided. The manufacturing method includes the following steps: A substrate having a first semiconductor device and a second semiconductor device formed thereon is provided. The first semiconductor device includes a first gate trench and the second semiconductor device includes a second gate trench. A first work function metal layer is formed in the first gate trench and the second gate trench. A portion of the first work function metal layer is removed from the second gate trench. A second work function metal layer is formed in the first gate trench and the second gate trench. The second work function metal layer and the first work function metal layer include the same metal material. A third work function metal layer and a gap-filling metal layer are sequentially formed in the first gate trench and the second gate trench.

According to another aspect of the present invention, a semiconductor device having metal gate is provided. The semiconductor device includes a substrate, a first metal gate positioned on the substrate, and a second metal gate positioned on the substrate. The first metal gate includes a first P-work function metal layer, an N-work function metal layer, and a gap-filling layer. The second metal gate includes a second P-work function metal layer, the N-work function metal layer, and the gap-filling layer. The first P-work function metal layer and the second P-work function metal layer include a same metal material. A thickness of the first P-work function metal layer is larger than a thickness of the second P-work function metal layer. The first P-work function metal layer, the second P-work function metal layer, and the N-work function metal layer all include a U shape.

According to the manufacturing method of semiconductor devices having metal gate provided by the present invention, etch stop layer that is typically required in the prior art is omitted and thus the amount of layers formed in the gate trenches is reduced. Consequently, the metal gate process is simplified, the process complexity is reduced, and the gap-filling result is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-6 are drawings illustrating a manufacturing method for a semiconductor device having metal gate provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, and FIG. 6 is a schematic drawing in a step subsequent to FIG. 5.

FIGS. 7-11 are drawings illustrating a manufacturing method for a semiconductor device having metal gate provided by a second preferred embodiment of the present invention, wherein FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10.

FIGS. 12-17 are drawings illustrating a manufacturing method for a semiconductor device having metal gate provided by a third preferred embodiment of the present invention, wherein FIG. 13 is a schematic drawing in a step subsequent to FIG. 12, FIG. 14 is a schematic drawing in a step subsequent to FIG. 13, FIG. 15 is a schematic drawing in a step subsequent to FIG. 14, FIG. 16 is a schematic drawing in a step subsequent to FIG. 15, and FIG. 17 is a schematic drawing in a step subsequent to FIG. 16.

DETAILED DESCRIPTION

Figure 1:
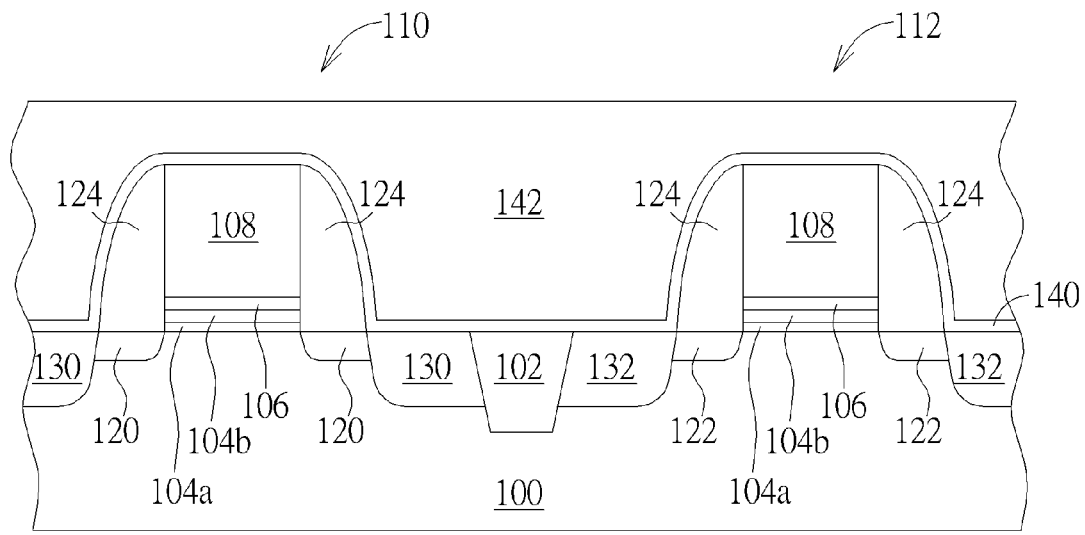

Please refer to FIGS. 1-6, which are drawings illustrating a manufacturing method for a semiconductor device having metal gate provided by a first preferred embodiment of the present invention. As shown in FIG. 1, the preferred embodiment first provides a substrate 100 such as a silicon substrate, a silicon-containing substrate, or a silicon-on-insulator (SOI) substrate. The substrate 100 includes a first semiconductor device 110 and a second semiconductor device 112 formed thereon. A shallow trench isolation (STI) 102 is formed in the substrate 100 between the first semiconductor device 110 and the second semiconductor device 112 for providing electrical isolation. The first semiconductor device 110 includes a first conductivity type, the second semiconductor device 112 includes a second conductivity type, and the first conductivity type and the second conductivity type are complementary. In the preferred embodiment, the first semiconductor device 110 is a p-typed semiconductor device and the second semiconductor device 112 is an n-typed semiconductor device.

Please still refer to FIG. 1. The first semiconductor device 110 and the second semiconductor device 112 respectively include an interfacial layer 104a, a high-k gate dielectric layer 104b, a bottom barrier layer 106 such as a titanium nitride (hereinafter abbreviated as TiN) layer, a dummy gate 108 such as a polysilicon layer, and a patterned hard mask (not shown) formed on the polysilicon layer for defining the dummy gate 108. It is noteworthy that the preferred embodiment is integrated with high-k first process, therefore the high-k gate dielectric layer 104b includes a flap shape. The high-k gate dielectric layer includes high-k materials such as rare earth metal oxide. The high-k gate dielectric layer 104b can include material selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST).

Please still refer to FIG. 1. The first semiconductor device 110 and the second semiconductor device 112 respectively include first lightly doped drains (LDDs) 120 and second LDDs 122, a spacer 124, a first source/drain 130 and a second source/drain 132. Salicides (not shown) are respectively formed on surfaces of the first source/drain 130 and the second source/drain 132. Additionally, the salicides can be formed after forming contact openings when the post contact salicide process is adopted. On the first semiconductor device 110 and the second semiconductor device 112, a contact etch stop layer (hereinafter abbreviated as CESL) 140 and an inter-layer dielectric (hereinafter abbreviated as ILD) layer 142 are sequentially formed. Since the steps and material choices for the abovementioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the first source/drain 130 and the second source/drain 132.

Figure 2:
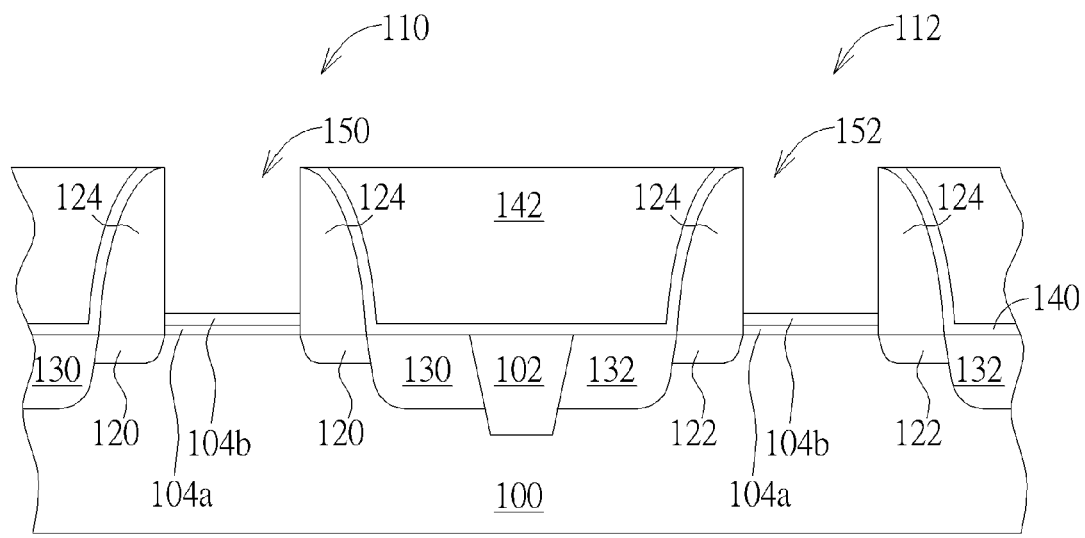

Please refer to FIG. 2. After forming the CESL 140 and the ILD layer 142, a planarization process is performed to remove a portion of the CESL 140 and a portion of the ILD layer 142 to expose the dummy gates 108 of the first semiconductor device 110 and the second semiconductor device 112. Subsequently, a suitable etching process is performed to remove the dummy gates 108 of the first semiconductor device 110 and the second semiconductor device 112. Consequently, a first gate trench 150 is formed in the first semiconductor device 110 and a second gate trench 152 is formed in the second semiconductor device 112, simultaneously. And the bottom barrier layer 106 is exposed in bottoms of both of the first gate trench 150 and the second gate trench 152.

Figure 3:
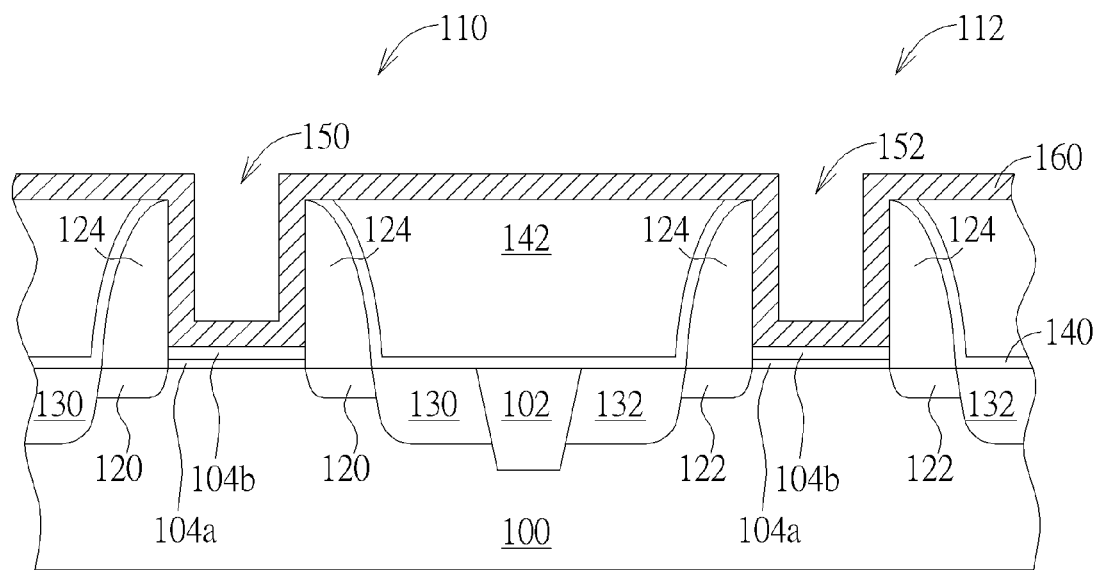

Please refer to FIGS. 2 and 3. After removing the dummy gates 108, the bottom barrier layer 106 is selectively removed depending on the process requirement. For example, the bottom barrier layer 106 is removed from the first gate trench 150 and the second gate trench 152 and thus the high-k gate dielectric layer 104b is exposed in the first gate trench 150 and the second gate trench 152 as shown in FIG. 2. After removing the bottom barrier layer 106 and exposing the high-k gate dielectric layer 104b, a first work function metal layer 160 is formed on the substrate 100, particularly formed in the first gate trench 150 and the second gate trench 152. The first work function metal layer 160 is a P-work function metal layer such as TiN, titanium carbide (TiC), tantalum nitride (TaN), tantalum carbide (TaC), tungsten carbide (WC), or aluminum titanium nitride (TiAlN), but not limited to this. Additionally, the first work function metal layer 160 can be a single layer or a multi layer.

Figure 4:
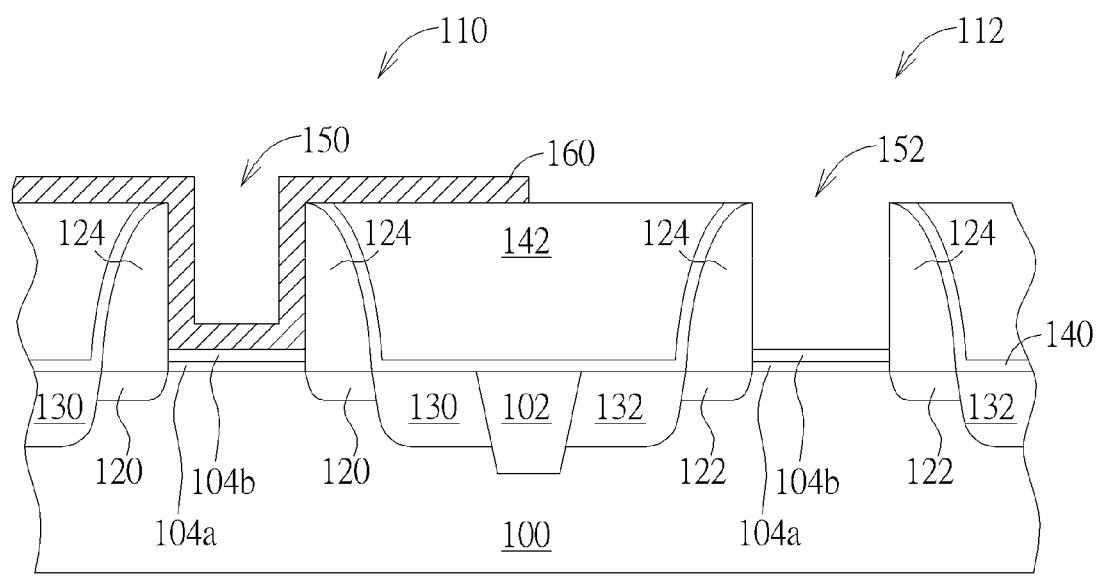

Please refer to FIG. 4. After forming the first work function metal layer 160, a patterned protecting layer (not shown) is formed on the substrate 100 to protect the first semiconductor device 110 and expose the second semiconductor device 112, particularly to expose the first work function metal layer 160 in the second gate trench 152. Subsequently, an etching process is performed to remove the first work function metal layer 160 from the second gate trench 152. It is noteworthy that this instant etching process stops at a surface of the high-k gate dielectric layer 104b. In other words, the high-k gate dielectric layer 104b is exposed in the second gate trench 152 after removing the portion of the first work function metal layer 160 from the second gate trench 152 while the first work function metal layer 160 is still remained in the first gate trench 150 and the first semiconductor device 110 as shown in FIG. 4.

Figure 5:
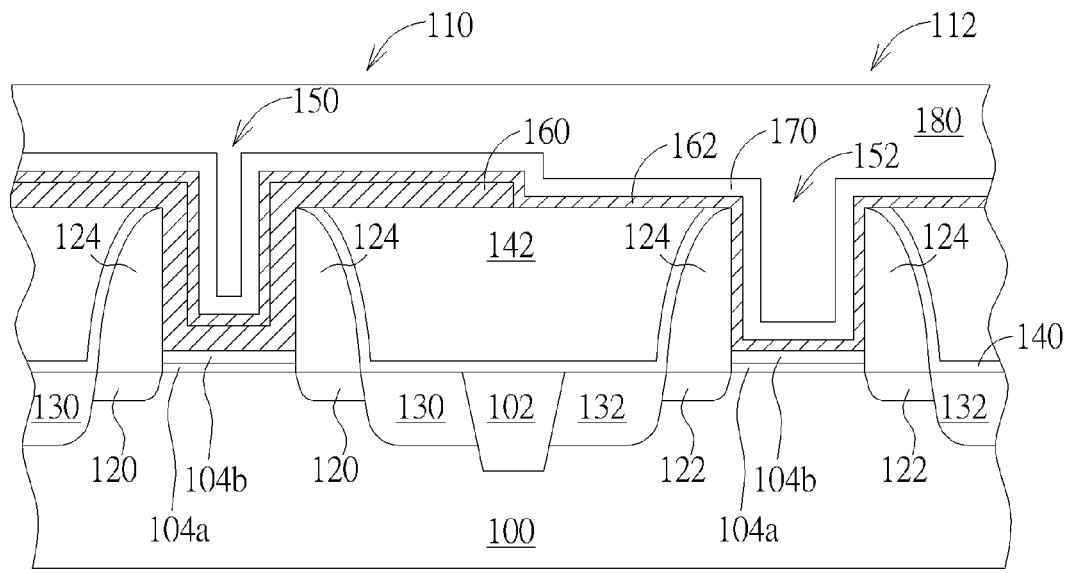

Please refer to FIG. 5. Next, a second work function metal layer 162 is formed in the first gate trench 150 and the second gate trench 152. It is noteworthy that the first work function metal layer 160 and the second work function metal layer 162 include a same metal material. However, a thickness of the first work function metal layer 160 is larger than a thickness of the second work function metal layer 162.

Please still refer to FIG. 5. After forming the second work function metal layer 162, a third work function metal layer 170 is formed on the substrate 100. In the preferred embodiment, a work function of the third work function metal layer 170 is complementary to the work function of the first work function metal layer 160 and the second work function metal layer 162. In other words, the third work function metal layer 170 is an N-work function metal layer. Accordingly, the third work function metal layer 170 can include titanium aluminide (TiAl), zirconium aluminide (ZrAl), tungsten aluminide (WAl), tantalum aluminide (TaAl), or hafnium aluminide (HfAl), but not limited to this. Additionally, the third work function metal layer 170 can be a single layer or a multi layer. After forming the third work function metal layer 170, the first gate trench 150 and the second gate trench 152 are filled up with a gap-filling metal layer 180. The gap-filling metal layer 180 includes materials with low resistance and superior gap-filling characteristic, such as Al, TiAl, or titanium aluminum oxide (TiAlO), but not limited to this.

Figure 6:
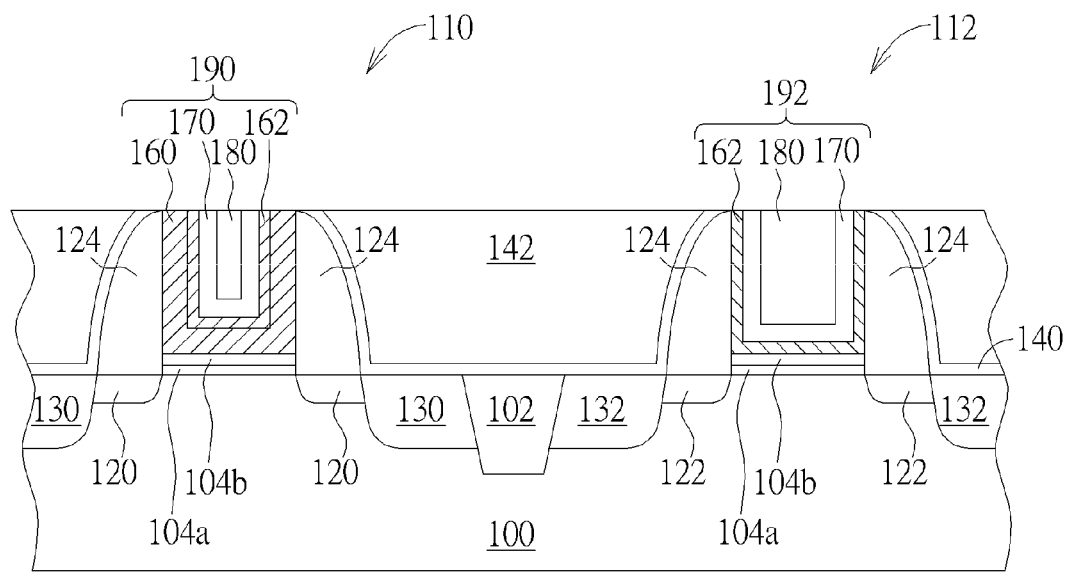

Please refer to FIG. 6. Subsequently, a planarization process, such as a CMP process, is performed to remove the superfluous gap-filling metal layer 180, third work function metal layer 170, second work function metal layer 162, and first work function metal layer 160. Consequently, a first metal gate 190 and a second metal gate 192 are obtained. In addition, the ILD layer 142 and the CESL 140 can be selectively removed and sequentially reformed on the substrate 100 for improving performance of the semiconductor devices 110/112 in the preferred embodiment. Since the abovementioned processes are well-known to those skilled in the art, those details are omitted in the interest of brevity.

It is noteworthy that the second work function metal layer 162 in the second gate trench 152 serves as a bottom barrier layer and thus electrical performance of the second metal gate 192 is improved. More important, since the thickness of the second work function metal layer 162 is insufficient to provide work function, the second work function metal layer 162 renders no impact to the second metal gate 192 (that is an N-metal gate). On the other hand, to the first metal gate 190, the first work function metal layer 160 and the second work function metal layer 162, which preferably include the same p-typed metal material, are taken as one P-work function metal layer, and the overall thickness of the first work function metal layer 160 and the second work function metal layer 162 achieves desirable and sufficient thickness to provide work function to the first metal gate 190 (that is a P-metal gate). As shown in FIG. 6, the first metal gate 190 and the second metal gate 192 provided by the present invention both include the P-work function metal layer and the N-work function metal layer, and the P-work function metal layer and the N-work function metal layer all include a U shape. Additionally, topmost portions of the U-shaped P-work function metal layer and the U-shaped N-work function metal layer are coplanar with the ILD layer 142. However, the first metal gate 190 includes the first work function metal layer 160 and the second work function metal layer 162 taken as a P-work function metal layer but the second metal gate 192 includes only the second work function metal layer 162. Briefly speaking, thickness of the N-work function metal layers in both of the first metal gate 190 and the second metal gate 192 are identical while the thickness of the P-work function metal layers in the first metal gate 190 and the second metal gate 192 are different.

According to the manufacturing method of semiconductor devices having metal gate provided by the preferred embodiment, the etch stop layer that is conventionally formed after forming the first work functional metal layer 160 is omitted: The portion of the first work function metal layer 160 is removed from the second gate trench 152 directly after forming the first work function metal layer 160. By forming the second work function metal layer 162 and the third work function metal layer 170, it is ensured that both of the first metal gate 190 (the P-metal gate) and the second metal gate 192 (the N-metal gate) obtain the required work function. Since the conventionally required etch stop layer is omitted from the manufacturing method of semiconductor devices having metal gate provided by the preferred embodiment, the process complexity is reduced and the gap-filling result is improved. Accordingly, the first semiconductor device 110 and the second semiconductor device 112 provided by the preferred embodiment are prevented from the seam and the adverse impact rendered from the seams, and further has the advantage of improved reliability.

Figure 7:
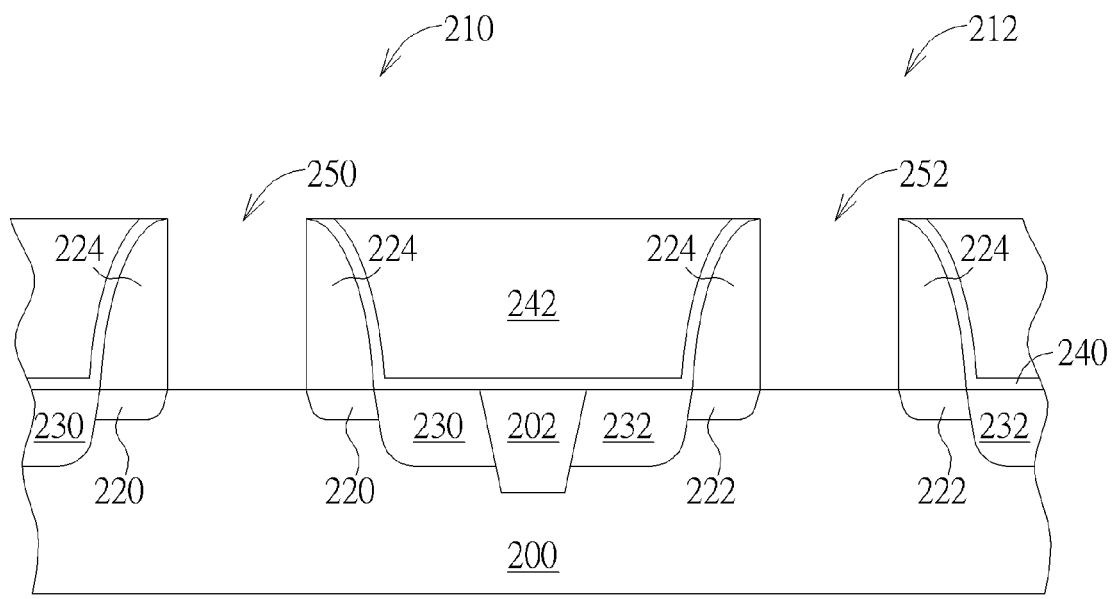

Please refer to FIGS. 7-11, which are drawings illustrating a manufacturing method for a semiconductor device having metal gate provided by a second preferred embodiment of the present invention. It is noteworthy that elements the same in the first and second preferred embodiments can include the same materials and conductivity types, and thus those details are omitted in the interested of brevity. As shown in FIG. 7, the preferred embodiment first provides a substrate 200 having a first semiconductor device 210 and a second semiconductor device 212 formed thereon, and a STI 202 is formed in the substrate 200 between the first semiconductor device 210 and the second semiconductor device 212 for providing electrical isolation. In the preferred embodiment, the first semiconductor device 210 is a p-typed semiconductor device and the second semiconductor device 212 is an n-typed semiconductor device.

Please still refer to FIG. 7. The first semiconductor device 210 and the second semiconductor device 212 respectively include a dielectric layer (not shown) and a dummy gate (not shown). The first semiconductor device 210 and the second semiconductor device 212 further respectively include first LDDs 220 and second LDDs 222, a spacer 224, a first source/drain 230 and a second source/drain 232. Salicides (not shown) are respectively formed on surfaces of the first source/drain 230 and the second source/drain 232. On the first semiconductor device 210 and the second semiconductor device 212, a CESL 240 and an ILD layer 242 are sequentially formed.

Please still refer to FIG. 7. Subsequently, a planarization process is performed to remove a portion of the CESL 240 and a portion of the ILD layer 242 and followed by performing a suitable etching process to remove the dummy gates of the first semiconductor device 210 and the second semiconductor device 212. Consequently, a first gate trench 250 is formed in the first semiconductor device 210 and a second gate trench 252 is formed in the second semiconductor device 212, simultaneously. And the dielectric layer or the substrate 200 is exposed at bottoms of both of the first gate trench 250 and the second gate trench 252.

Figure 8:
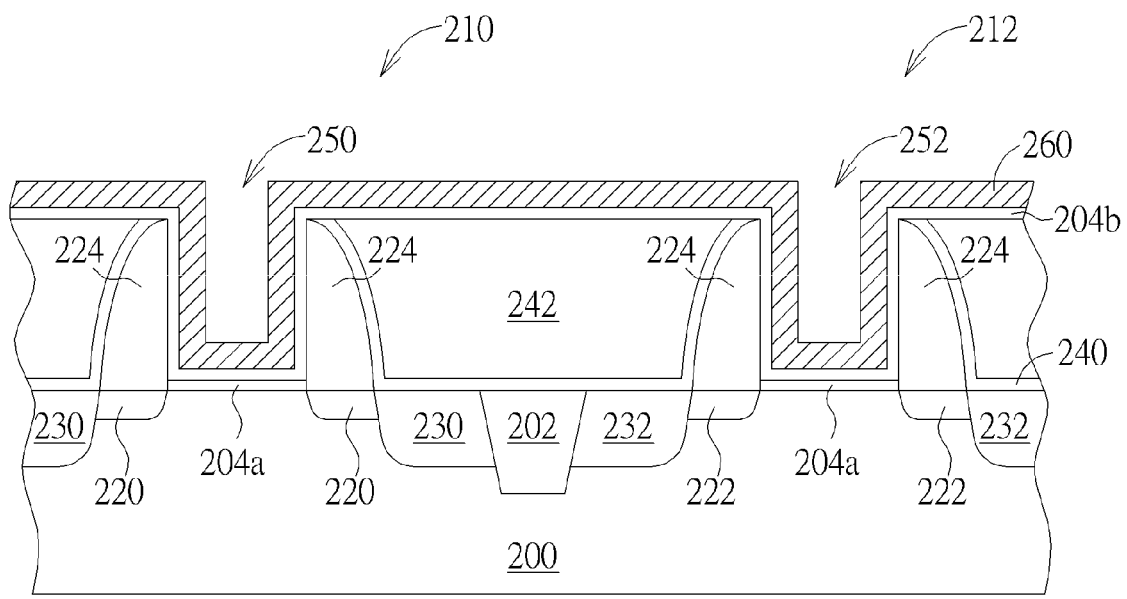

Please refer to FIG. 8. After forming the first gate trench 250 and the second gate trench 252, a high-k gate dielectric layer 204b is formed on the substrate 200. It is noteworthy that the preferred embodiment is integrated with the high-k last process, therefore the dielectric layer exposed in the gate trenches 250/252 can be used as an interfacial layer 204a. Or, as exemplarily disclosed by the preferred embodiment, the dielectric layer is also removed during removing the dummy gates and followed by forming an interfacial layer 204a by a chemical oxidation or a deposition before forming the high-k gate dielectric layer 204b. After forming the high-k gate dielectric layer 204b, a first work function metal layer 260 is formed on the substrate 200. In the preferred embodiment, the first work function metal layer 260 is a P-work function metal layer.

Figure 9:
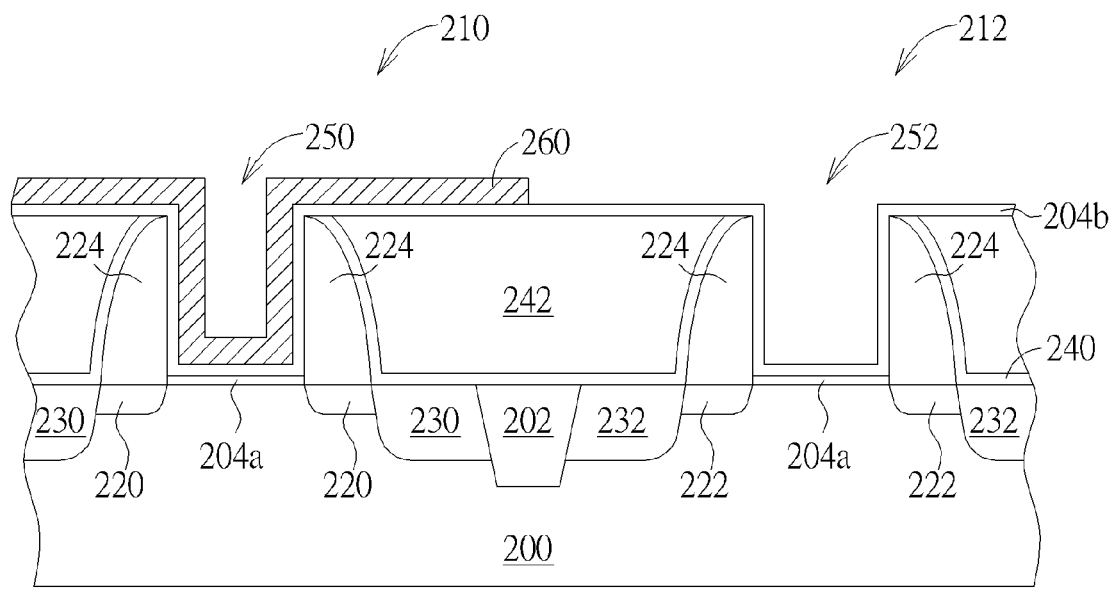

Please refer to FIG. 9. After forming the first work function metal layer 260, a patterned protecting layer (not shown) is formed on the substrate 200 to protect the first semiconductor device 210 and expose the second semiconductor device 212, particularly to expose the first work function metal layer 260 in the second gate trench 252. Subsequently, an etching process is performed to remove a portion of the first work function metal layer 260 from the second gate trench 252. It is noteworthy that this instant etching process stops at a surface of the high-k gate dielectric layer 204b. In other words, the high-k gate dielectric layer 204b is exposed in the second gate trench 252 after removing the portion of the first work function metal layer 260 from the second gate trench 252 while the first work function metal layer 260 is still remained in the first gate trench 250 and the first semiconductor device 210 as shown in FIG. 9.

Figure 10:
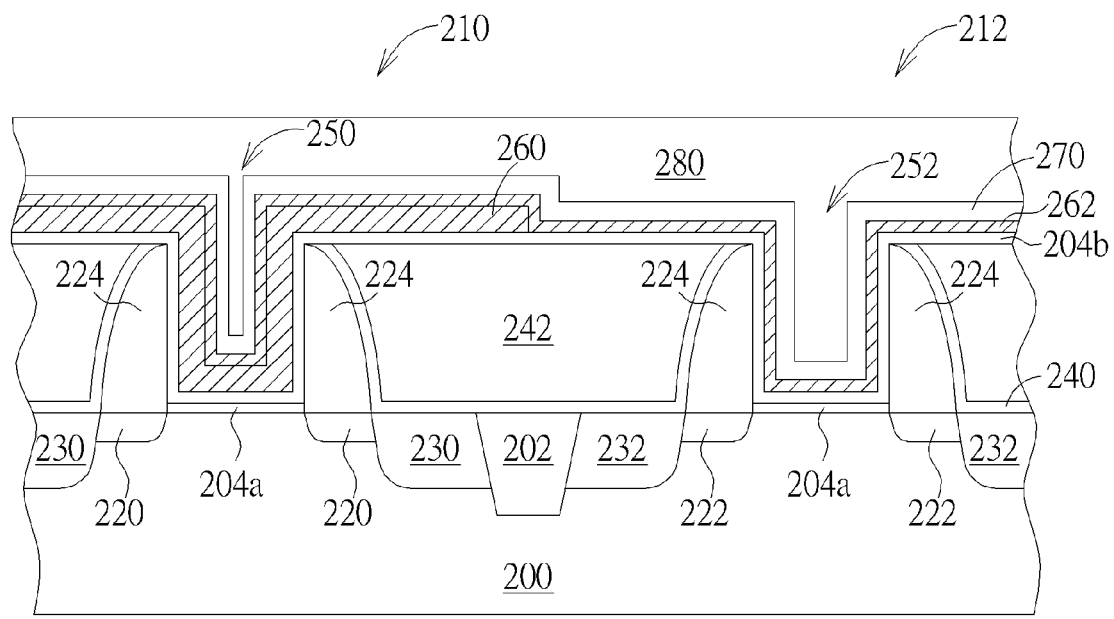

Please refer to FIG. 10. Next, a second work function metal layer 262 is formed in the first gate trench 250 and the second gate trench 252. It is noteworthy that the first work function metal layer 260 and the second work function metal layer 262 include a same metal material. However, a thickness of the first work function metal layer 260 is larger than a thickness of the second work function metal layer 262. After forming the second work function metal layer 262, a third work function metal layer 270 and a gap-filling metal layer 280 are sequentially formed on the substrate 200. In the preferred embodiment, the third work function metal layer 270 is an N-work function metal layer.

Figure 11:
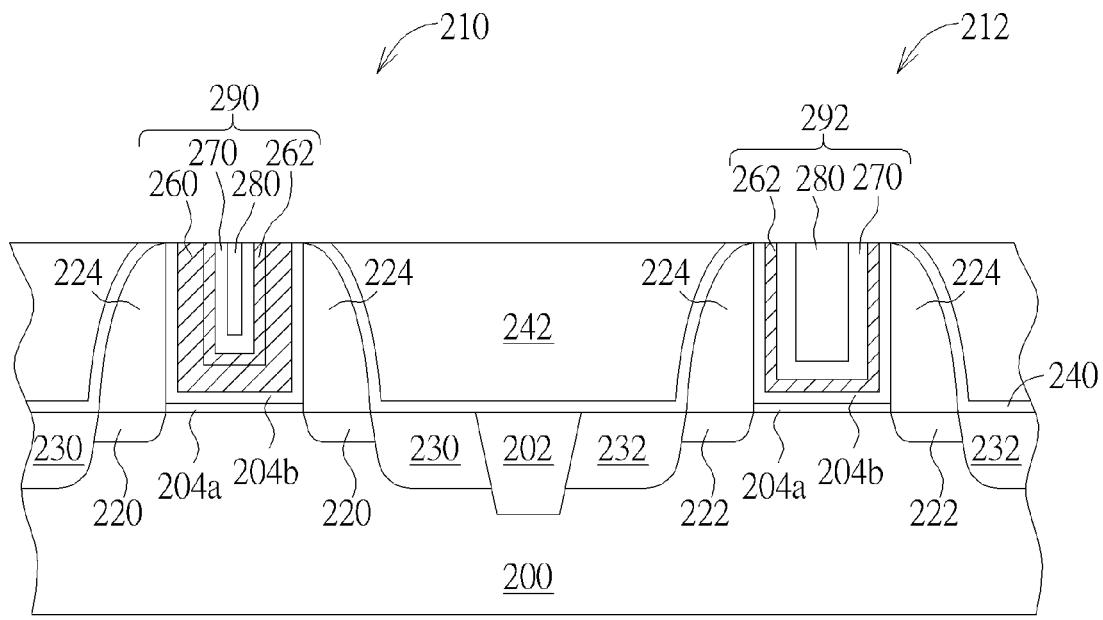

Please refer to FIG. 11. Subsequently, a planarization process, such as a CMP process, is performed to remove the superfluous gap-filling metal layer 280, third work function metal layer 270, second work function metal layer 262, first work function metal layer 260, and high-k gate dielectric layer 204b. Consequently, a first metal gate 290 and a second metal gate 292 are obtained. As mentioned above, the second work function metal layer 262 in the second gate trench 252 serves as a bottom barrier layer and thus electrical performance of the second metal gate 292 is improved. More important, since the thickness of the second work function metal layer 262, which is smaller than the thickness of the first work function metal layer 260, is insufficient to provide work function, the second work function metal layer 262 renders no impact to the second metal gate 292 (that is an N-metal gate). On the other hand, to the first metal gate 290, the first work function metal layer 260 and the second work function metal layer 262, which preferably include the same p-typed metal material, are taken as one P-work function metal layer, and the overall thickness of the first work function metal layer 260 and the second work function metal layer 262 achieves desirable and sufficient thickness to provide work function to the first metal gate 290 (that is a P-metal gate). As shown in FIG. 11, the first metal gate 290 and the second metal gate 292 provided by the present invention both include the P-work function metal layer and the N-work function metal layer. Furthermore, the P-work function metal layer, the N-work function metal layer, and the high-k gate dielectric layer 204b all include a U shape. Additionally, topmost portions of the U-shaped P-work function metal layer, the U-shaped N-work function metal layer, and the U-shaped high-k gate dielectric layer 204b are coplanar with the ILD layer 242. However, the first metal gate 290 includes the first work function metal layer 260 and the second work function metal layer 262 taken as a P-work function metal layer but the second metal gate 292 includes only the second work function metal layer 262. Briefly speaking, thickness of the N-work function metal layers in both of the first metal gate 290 and the second metal gate 292 are identical while the thickness of the P-work function metal layers in the first metal gate 290 and the second metal gate 292 are different.

Accordingly, the manufacturing method of semiconductor devices having metal gate provided by the preferred embodiment is integrated with the high-k last process, and the etch stop layer that is conventionally formed after forming the first work functional metal layer is omitted: The portion of the first work function metal layer 260 is removed from the second gate trench 252 directly after forming the first work function metal layer 260. By forming the second work function metal layer 262 and the third work function metal layer 270, it is ensured that both of the first metal gate 290 (the P-metal gate) and the second metal gate 292 (the N-metal gate) obtain the required work function. Since the conventionally required etch stop layer is completely omitted from the manufacturing method of semiconductor devices having metal gate provided by the preferred embodiment, the process complexity is reduced and the gap-filling result is improved. Accordingly, the first semiconductor device 210 and the second semiconductor device 212 provided by the preferred embodiment are prevented from the seam and the adverse impact rendered from the seams, and further has the advantage of improved reliability.

Figure 12:
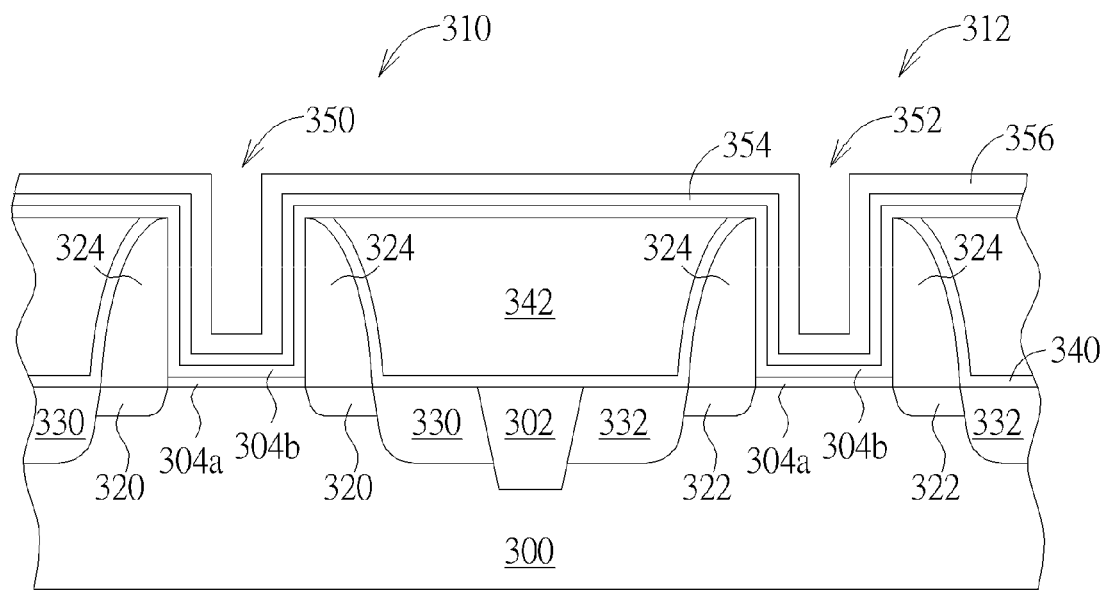

Please refer to FIGS. 12-17, which are drawings illustrating a manufacturing method for a semiconductor device having metal gate provided by a third preferred embodiment of the present invention. It is noteworthy that elements the same in the first, second, and third preferred embodiments can include the same materials and conductivity types, and thus those details are omitted in the interested of brevity. As shown in FIG. 12, the preferred embodiment first provides a substrate 300 having a first semiconductor device 310 and a second semiconductor device 312 formed thereon, and a STI 302 is formed in the substrate 300 between the first semiconductor device 310 and the second semiconductor device 312 for providing electrical isolation. In the preferred embodiment, the first semiconductor device 310 is a p-typed semiconductor device and the second semiconductor device 312 is an n-typed semiconductor device.

Please still refer to FIG. 12. The first semiconductor device 310 and the second semiconductor device 312 respectively include a dielectric layer (not shown) and a dummy gate (not shown). The first semiconductor device 310 and the second semiconductor device 312 further respectively include first LDDs 320 and second LDDs 322, a spacer 324, a first source/drain 330 and a second source/drain 332. Salicides (not shown) are respectively formed on surfaces of the first source/drain 330 and the second source/drain 332. On the first semiconductor device 310 and the second semiconductor device 312, a CESL 340 and an ILD layer 342 are sequentially formed. Subsequently, a planarization process is performed to remove a portion of the CESL 340 and a portion of the ILD layer 342 and followed by performing a suitable etching process to remove the dummy gates of the first semiconductor device 310 and the second semiconductor device 312. Consequently, a first gate trench 350 is formed in the first semiconductor device 310 and a second gate trench 352 is formed in the second semiconductor device 312, simultaneously. And the dielectric layer or the substrate 300 is exposed at bottoms of both of the first gate trench 350 and the second gate trench 352.

Please still refer to FIG. 12. After forming the first gate trench 350 and the second gate trench 352, a high-k gate dielectric layer 304b is formed on the substrate 300. It is noteworthy that the preferred embodiment is integrated with the high-k last process, therefore the dielectric layer exposed in the gate trenches 350/352 can be used as an interfacial layer 304a. Or, as exemplarily disclosed by the preferred embodiment, the dielectric layer is also removed during removing the dummy gates and followed by forming an interfacial layer 304a by a thermal oxidation or a deposition before forming the high-k gate dielectric layer 304b. After forming the high-k gate dielectric layer 304b, a bottom barrier layer 354 and a cap layer 356 are sequentially formed on the substrate 300. According to the preferred embodiment, the bottom barrier layer 354 can be a TiN layer and the cap layer 356 can be a silicon layer.

Figure 13:
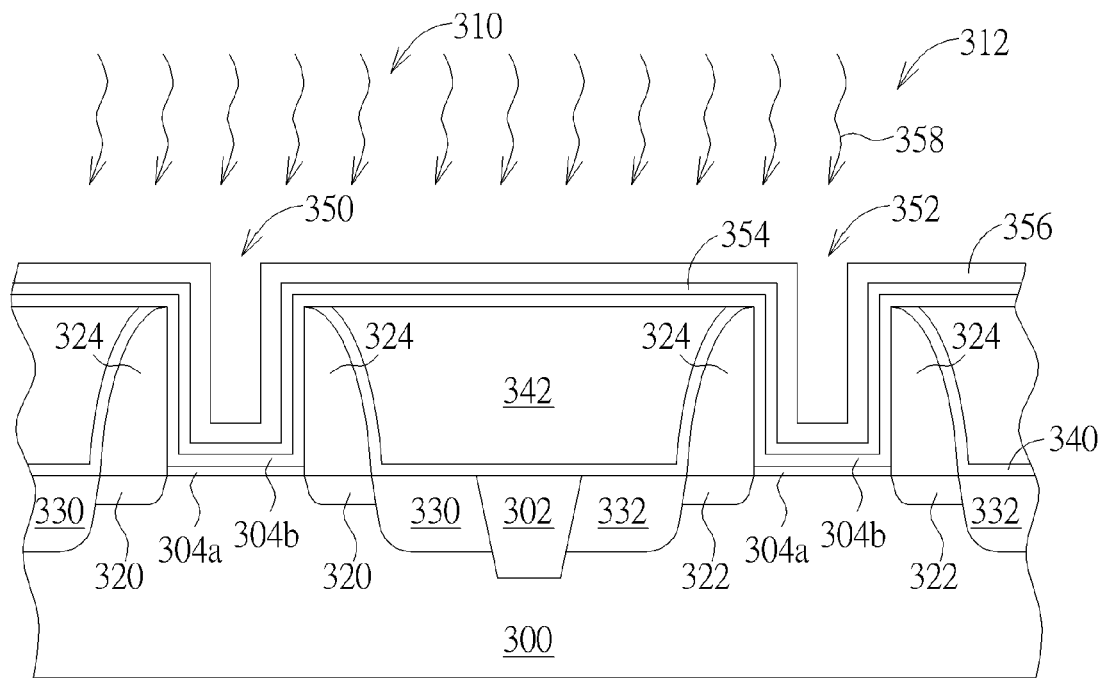
Figure 14:
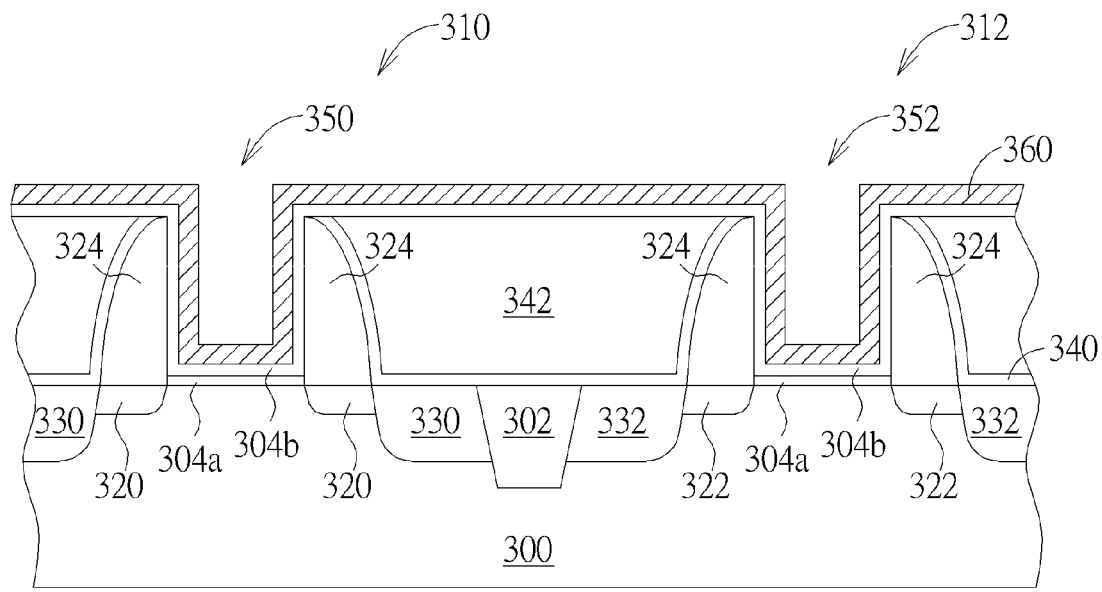

Please refer to FIGS. 13-14. After forming the cap layer 356, a thermal treatment 358 is performed to the cap layer 356 for improving the characteristics of the high-k gate dielectric layer 304b. The thermal treatment 358 is performed in a nitrogen or oxygen ambient. Next, the cap layer 356 and the bottom barrier layer 354 are both removed and followed by forming a first work function metal layer 360. In the preferred embodiment, the first work function metal layer 360 is also a P-work function metal layer.

Figure 15:
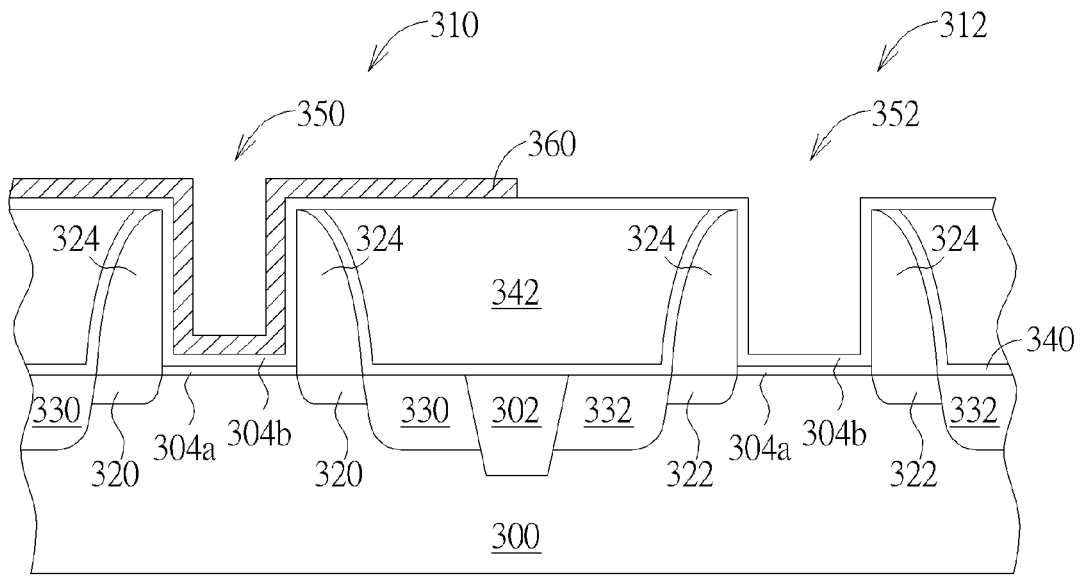

Please refer to FIG. 15. After forming the first work function metal layer 360, a patterned protecting layer (not shown) is formed on the substrate 300 to protect the first semiconductor device 310 and expose the second semiconductor device 312, particularly to expose the first work function metal layer 360 in the second gate trench 352. Subsequently, an etching process is performed to remove a portion of the first work function metal layer 360 from the second gate trench 352. It is noteworthy that this instant etching process stops at a surface of the high-k gate dielectric layer 304b. In other words, the high-k gate dielectric layer 304b is exposed in the second gate trench 252 again after removing the first work function metal layer 360 from the second gate trench 352 while the first work function metal layer 360 is still remained in the first gate trench 350 and the first semiconductor device 310 as shown in FIG. 15.

Figure 16:
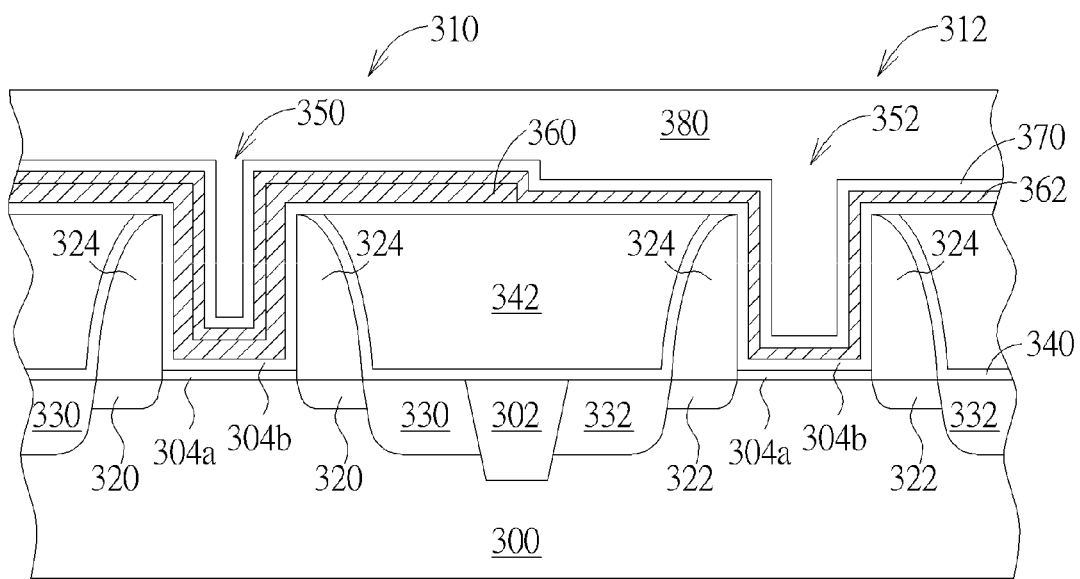

Please refer to FIG. 16. Next, a second work function metal layer 362 is formed in the first gate trench 350 and the second gate trench 352. It is noteworthy that the first work function metal layer 360 and the second work function metal layer 362 include a same metal material. However, a thickness of the first work function metal layer 360 is larger than a thickness of the second work function metal layer 362. After forming the second work function metal layer 362, a third work function metal layer 370 and a gap-filling metal layer 380 are sequentially formed on the substrate 300. In the preferred embodiment, the third work function metal layer 370 is an N-work function metal layer.

Figure 17:
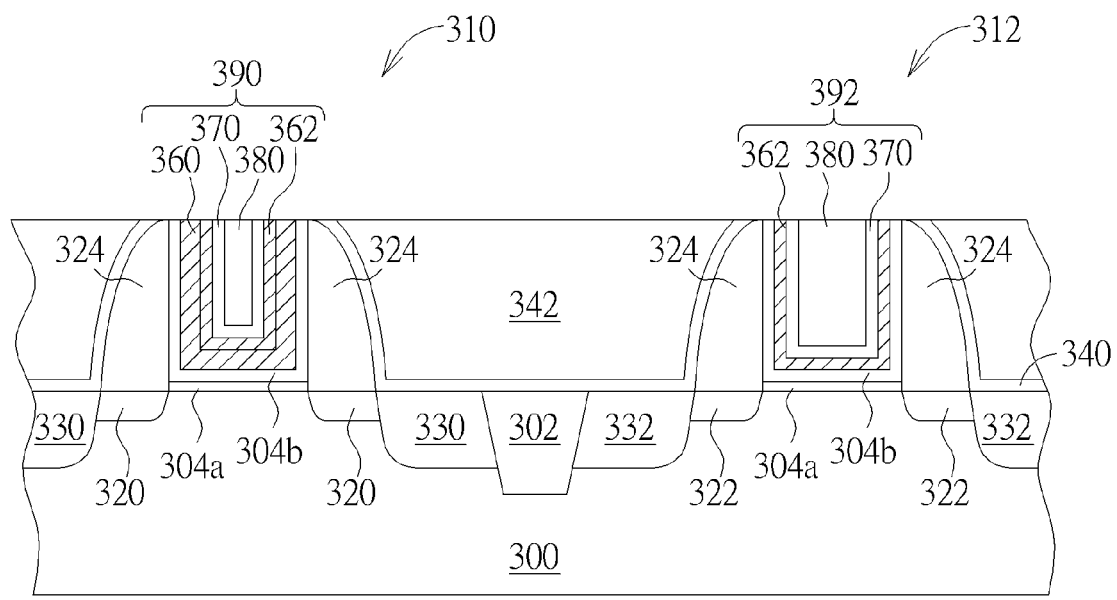

Please refer to FIG. 17. Subsequently, a planarization process, such as a CMP process, is performed to remove the superfluous gap-filling metal layer 380, third work function metal layer 370, second work function metal layer 362, first work function metal layer 360, and the high-k gate dielectric layer 304b. Consequently, a first metal gate 390 and a second metal gate 392 are obtained. As mentioned above, the second work function metal layer 362 in the second gate trench 352 serves as a bottom barrier layer and thus electrical performance of the second metal gate 392 is improved. More important, since the thickness of the second work function metal layer 362, which is smaller than the thickness of the first work function metal layer 360, is insufficient to provide work function, the second work function metal layer 362 renders no impact to the second metal gate 392 (that is an N-metal gate). On the other hand, to the first metal gate 390, the first work function metal layer 360 and the second work function metal layer 362, which preferably include the same p-typed metal material, are taken as one P-work function metal layer, and the overall thickness of the first work function metal layer 360 and the second work function metal layer 362 achieves desirable and sufficient thickness to provide work function to the first metal gate 390 (that is a P-metal gate). As shown in FIG. 17, the first metal gate 390 and the second metal gate 392 provided by the present invention both include the P-work function metal layer and the N-work function metal layer. Furthermore, the P-work function metal layer, the N-work function metal layer, and the high-k gate dielectric layer 304b all include a U shape. Additionally, topmost portions of the U-shaped P-work function metal layer, the U-shaped N-work function metal layer, and the U-shaped high-k gate dielectric layer 304b are coplanar with the ILD layer 342. However, the first metal gate 390 includes the first work function metal layer 360 and the second work function metal layer 362 taken as a P-work function metal layer but the second metal gate 392 includes only the second work function metal layer 362. Briefly speaking, thickness of the N-work function metal layers in both of the first metal gate 390 and the second metal gate 392 are identical while the thickness of the P-work function metal layers in the first metal gate 390 and the second metal gate 392 are different.

Accordingly, the manufacturing method of semiconductor devices having metal gate provided by the preferred embodiment is also integrated with the high-k last process, and the etch stop layer that is conventionally formed after forming the first work functional metal layer is omitted: The portion of the first work function metal layer 360 is removed from the second gate trench 352 directly after forming the first work function metal layer 360. By forming the second work function metal layer 362 and the third work function metal layer 370, it is ensured that both of the first metal gate 390 (the P-metal gate) and the second metal gate 392 (the N-metal gate) obtain the required work function. Since the conventionally required etch stop layer is completely omitted from the manufacturing method of semiconductor devices having metal gate provided by the preferred embodiment, the process complexity is reduced and the gap-filling result is improved. Accordingly, the first semiconductor device 310 and the second semiconductor device 312 provided by the preferred embodiment are prevented from the seam and the adverse impact rendered from the seams, and further has the advantage of improved reliability. Parenthetically, by forming the bottom barrier layer 354 and the cap layer 356 and by performing the thermal treatment 358, the characteristics of the high-k gate dielectric layer 304b is improved according to the preferred embodiment.

Accordingly, the manufacturing method of semiconductor devices having metal gate provided by the present invention can be integrated with high-k first or high-k last process. More important, etch stop layer that is typically required in the prior art is completely omitted and thus the amount of layer formed in the gate trenches is reduced. Consequently, the metal gate process is simplified, the process complexity is reduced, and the gap-filling result is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device having metal gate comprising:
    a substrate;
    a first metal gate positioned on the substrate, the first metal gate comprising a first P-work function metal layer, an N-work function metal layer, and a gap-filling metal layer; and
    a second metal gate positioned on the substrate, the second metal gate comprising a second P-work function metal layer, the N-work function metal layer, and the gap-filling metal layer, wherein
    the first P-work function metal layer and the second P-work function metal layer comprise a same metal material and a same metal concentration, a thickness of the first P-work function metal layer is larger than a thickness of the second P-work function metal layer, and the first P-work function metal layer, the second P-work function metal layer, and the N-work function metal layer comprise a U shape.

2. The semiconductor device having metal gate according to claim 1, further comprising a high-k gate dielectric layer formed in between the first metal gate and the substrate, and between the second metal gate and the substrate.

3. The semiconductor device having metal gate according to claim 2, wherein the high-k gate dielectric layer comprises a U shape.

4. The semiconductor device having metal gate according to claim 2, wherein the high-k gate dielectric layer comprises a flat shape.

5. The semiconductor device having metal gate according to claim 2, further comprises an interfacial layer positioned between the high-k gate dielectric layer and the substrate.

\* \* \* \* \*